Aug. 25, 1970 G. EBERHARD ET AL 3,525,909
TRANSISTOR FOR USE IN AN EMITTER CIRCUIT
WITH EXTENDED EMITTER ELECTRODE
Filed Sept. 8, 1967

United States Patent Office 3,525,909 Patented Aug. 25, 1970

3,525,909

TRANSISTOR FOR USE IN AN EMITTER CIRCUIT WITH EXTENDED EMITTER ELECTRODE

Gunther Eberhard, Munich, and Richard Wiesner, Neukeferloh, near Munich, Germany, assignors to Siemens Aktiengesellschaft, a corporation of Germany Filed Sept. 8, 1967, Ser. No. 666,357
Claims priority, application Germany, Sept. 12, 1966, S 105,814
Int. Cl. H01l 3/00, 5/00
U.S. Cl. 317—234 1 Claim

ABSTRACT OF THE DISCLOSURE

The present invention relates to a semiconductor device with at least one transistor, operated in an emitter circuit, whose surface is coated, at least in a region bridging the base region, with an insulating protective layer, preferably comprised of $SiO_2$ or $Si_3N_4$. In accordance with the present invention, the emitter electrode extends beyond the collector region, in an electrode portion seated directly upon the insulating protective layer. The protective layer is usually a thin layer of an insulating material, preferably of $SiO_2$ or $Si_3N_4$.

The known planar method is indicative of the present state of the art. In this method, a masking layer of $SiO_2$ or $Si_3N_4$ is applied at the planar surface of a silicon monocrystal. A diffusion window extending at least to the semiconductor surface is etched into said layer. The portion of the semiconductor surface thus exposed is brought into contact with a gaseous activator, which may diffuse into the semiconductor, while the masking layer prevents said activator from penetrating into the semiconductor at the coated localities of the semiconductor surface. A repetition of the process, following the regrowth of the mask and the production of new diffusion windows, leads to complicated semiconductor devices, especially transistors or integrated circuit devices. It is possible to apply or produce masked layers also at the surface of semiconductor crystals of other semiconductor materials, thus also using the planar technique on such semiconductors.

Experience has shown that the above-described production method causes changes in the conductivity below the masked layer, i.e. in those regions of the semiconductor crystal which are not subjected to the diffusion processes. For example, the formation of oxide and other masked layers, which occurs naturally, for example through the application of heat, influences the basic doping in the immediately adjacent semiconductor material. Thus, for example during the production of silicon planar transistors with thermally produced $SiO_2$ layers, concentration layers will form below the oxide when the semiconductor is n-type. Other influences occur in p-conducting material, which result in depletion at the boundary. This manifestation influences the electrical behavior, producing, for example, in a weakly n-conducting collector formed by the original material of the semiconductor and a strongly p-conducting base, a reduction in the break-down voltage of the p-n junction between the collector and the base.

To overcome such and similar shortcomings, the base electrode has been developed so that it is seated upon the protective layer and extends noticeably across the latter, up to the collector region. In case a biasing voltage is applied between the collector and the base regions, the aforementioned possibility effects a reduction in the concentration rim layer directly below the protective oxide layer, thereby increasing the break-down voltage. At the same time, this electrode which is an extended base electrode, produces additional capacitance between the collector and the base and, thus, an increased feedback capacitance $C_{re}$ in the emitter circuit.

The product from a voltage amplification $V_u$ and a limiting frequency $fg$ of a wide band stage with a load resistance $R_L$ and a load capacitance $C_L$ is expressed approximately as follows:

$$2fgV_u=\frac{1}{\frac{Rg+r_b}{R_L}\left(C_{re}R_L+\frac{1}{2\pi f_T}\right)+\left(r_e+\frac{r_b+Rg}{\beta_o}\right)(C_L+C_C)}$$

($r_b$ base resistance, $r_e$ emitter diffusion resistance, $Rg$ generator resistance, $\beta_o$ current amplification, $f_T$ transit frequency, and $C_C$ output capacitance). Hence, an increase in the feedback capacitance results in a reduction of the amplification band width product.

The present invention relates to a semiconductor device with at least one transistor, operated in an emitter circuit, whose surface is coated, at least in a region bridging the base region, with an insulating protective layer, preferably comprised of $SiO_2$ or $Si_3N_4$. In accordance with the present invention, the emitter electrode extends beyond the collector region, in an electrode portion seated directly upon the insulating protective layer. The protective layer is usually a thin layer of an insulating material, preferably of $SiO_2$ or $Si_3N_4$.

The most important embodiment of the invention is probably the arrangement of planar transistors. An example is shown with reference to the drawing in which—

Figure 1:
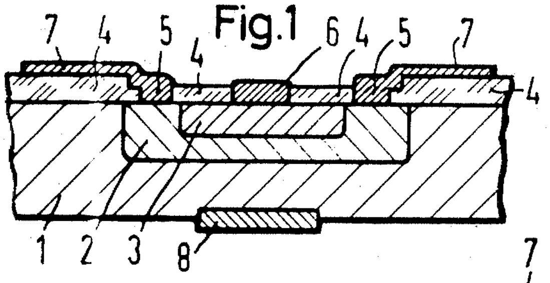
FIG. 1 shows the known planar technique.
Figure 2:
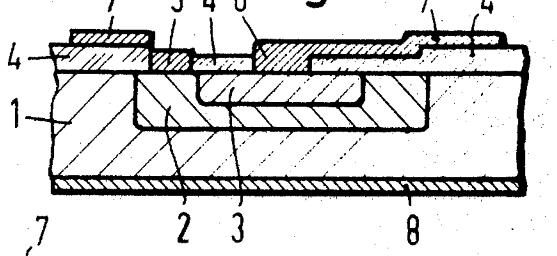
FIG. 2 shows the present invention.

In FIG. 1, which illustrates the up-to-now employed planar technique, the base region extends beyond the base collector p-n junction, while FIG. 2 utilizes the method of the present invention. The reference numerals are the same in both figures as they are in all the figures insofar as they relate to corresponding portions. In the figures, 1 is the original material of the semiconductor monocrystal which is not subjected to the diffusion process, for example a silicon crystal, which in this example we will assume to be n-conducting. As a result of the first diffusion process, carried out according to the planar method, using, for example, boron oxide as the activator, the base region 2 was produced of p-conducting material. In said region a third region 3, of the same conductance type as the initial material, was produced, using, for example, a phosphorus diffusion. The mask 4, which is $SiO_2$, is shown in its final stage. The base electrode is shown at 5 and the emitter electrode at 6. A special window was left open or produced in the $SiO_2$ mask, for contacting purposes of the emitter. As FIG. 1 shows, the base electrode 5 extends outwardly in a portion 7, which is seated directly on the $SiO_2$ layer 4.

In accordance with the present invention as is seen in FIG. 2, it is not the base electrode, but the emitter electrode which extends across the collector region on the protective layer 4. Thus the additional capacitance appears as an output capacitance and not as a feedback capacitance, and thus only slightly acts upon the amplification band width product.

Figure 3:
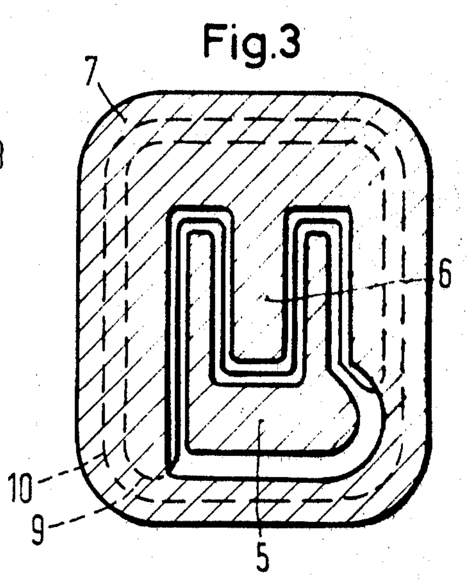
FIG. 3 shows another embodiment of the invention.

Thus, in accordance with the present invention, it is not the base electrode 5, but rather the emitter electrode 6 which extends across the oxide layer in a portion 7, as is illustrated in FIG. 2. This is also seen in FIG. 3, wherein the outer portion 7 of the area 6 constitutes an elongation of the emitter electrode which extends not only across the emitter base boundary 9 but also beyond the base-collector boundary 10 and which maintains an ohmic contact wtih the emitter surface, characterized by the edge 9. The inside portion of the area 6 constitutes the actual contact of the emitter.

As shown in FIG. 3, in a further development of the present invention, it is recommended that, despite the planar method used in production whereby the base region must be produced prior to the emitter region, the emitter electrode must annularly, particularly concentrically, surround the base electrode. Several embodiment examples are feasible here.

For example, in a circular silicon or germanium disc a concentric, circular base region is produced by means of the planar method. The emitter is then produced as the region which annularly encloses the middle of the base region which at no point contacts the original base material of the semiconductor which is the collector region of the transistor. The base region is then contacted by a central electrode which is annularly surrounded by the emitter electrode. The emitter electrode extends outwardly, at least in some places, across the base-collector junction and covers, in the sense of the present invention, a portion of the oxide layer in the collector region, as illustrated in FIG. 4.

Figure 5:
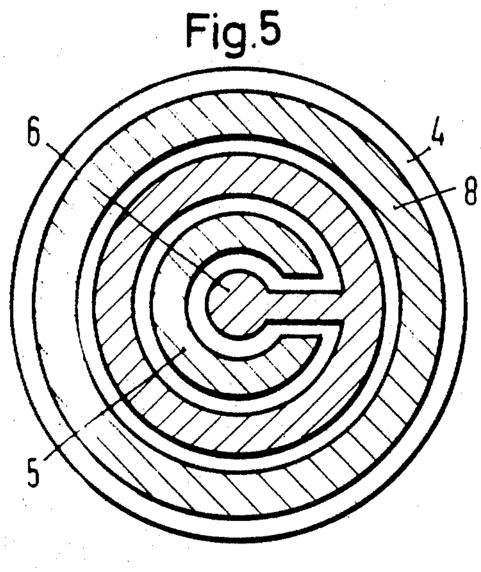

An alternative to this arrangement is found in a central location as well as in contacting the emitter region. However, since in accordance with the present invention, the portion which enlarges the emitter electrode extends outwardly, widening across the collector region into an annular region, it concentrically surrounds the base electrode which is concentrically arranged but not developed into a full ring (see FIG. 5). In all of the embodiment examples, the collector electrode may be arranged outside of the portion of the emitter electrode which covers the collector region, and proceed concentrically to the center of said electrode and the semiconductor disc.

Figure 4:
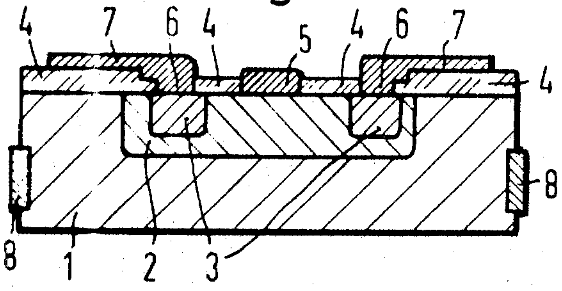
FIGS. 4 and 5 show still other embodiments.

A device may be used which is similar to the base electrode in FIG. 4, and is concentrically positioned to the base electrode. Finally, a remote contacting of the collector region is also possible. The collector electrode is indicated by 8, in the figures.

The present invention may be successfully applied also in other transistor types, for example in mesa transistors and even in power transistors, where load carriers are injected from an emitter into a base region and from there reach the collector, provided these transistors are covered with a protective layer which was applied, for example, with an increase in temperature. While n-p-n devices are shown, the invention is also applicable to other devices such as p-n-p.

We claim:

1. Transistor for use in a grounded emitter circuit, wherein said transistor is formed of or in a semiconductor body, the surface of which is covered with an insulating protective layer at least in an area extending from the collector region to the emitter region to bridge the base region of said transistor, and wherein the emitter electrode of the transistor is formed with an extension resting immediately on the protective layer along the whole length of the boundary between the collector and base zones at the surface of the semiconductor body, said emitter electrode is centrally arranged and concentrically surrounded by its extension which extends beyond the base region, and the base electrodes are arranged in intermediary spaces between the actual emitter electrode and its elongation, preferably in a concentric position, relative to the emitter electrode.

References Cited

UNITED STATES PATENTS

| | | | |
|---|---|---|---|
| 2,981,877 | 4/1961 | Noyce | 317—235 |
| 3,336,508 | 8/1967 | Preletz | 317—101 |
| 3,204,321 | 9/1965 | Kile | 29—25.3 |
| 3,373,323 | 3/1968 | Wolfrum et al. | 317—235 |
| 3,316,466 | 4/1967 | Husa et al. | 317—235 |
| 3,292,057 | 12/1966 | Touchy | 317—234 |
| 3,426,253 | 2/1969 | Rocque | 317—234 |

JOHN W. HUCKERT, Primary Examiner

B. ESTRIN, Assistant Examiner

U.S. Cl. X.R.

317—235